(12) United States Patent
Zhang et al.

(10) Patent No.: US 9,331,641 B2
(45) Date of Patent: May 3, 2016

(54) CIRCUIT STRUCTURE FOR ACHIEVING ADAPTIVE FUNCTION IN CLASS-D AUDIO POWER AMPLIFIER CIRCUIT

(71) Applicant: China Resources Semico Co., Ltd., Wuxi, Jiangsu (CN)

(72) Inventors: Dianjun Zhang, Wuxi (CN); Yongkang Lv, Wuxi (CN); Linjun Wei, Wuxi (CN)

(73) Assignee: WUXI CHINA RESOURCES SEMICO CO., Wuxi, Jiangsu (CN)

( * ) Notice: Subject to any disclaimer, the term of this patent is extended or adjusted under 35 U.S.C. 154(b) by 201 days.

(21) Appl. No.: 14/130,485

(22) PCT Filed: Dec. 5, 2012

(86) PCT No.: PCT/CN2012/085933
§ 371 (c)(1),
(2) Date: Dec. 31, 2013

(87) PCT Pub. No.: WO2013/127216
PCT Pub. Date: Sep. 6, 2013

(65) Prior Publication Data
US 2014/0133678 A1    May 15, 2014

(30) Foreign Application Priority Data
Feb. 27, 2012  (CN) .......................... 2012 1 0045465

(51) Int. Cl.
*H03F 3/181* (2006.01)
*H03F 3/217* (2006.01)
*H03F 3/20* (2006.01)

(52) U.S. Cl.
CPC ................. *H03F 3/181* (2013.01); *H03F 3/20* (2013.01); *H03F 3/217* (2013.01)

(58) Field of Classification Search
None
See application file for complete search history.

(56) References Cited

U.S. PATENT DOCUMENTS

| 2002/0005753 | A1 | 1/2002 | Takagishi |
| 2005/0156665 | A1 | 7/2005 | Maejima |
| 2013/0136278 | A1* | 5/2013 | Quilter .................. H03F 3/2173 381/118 |

FOREIGN PATENT DOCUMENTS

| CN | 2810028 | Y | 8/2006 |
| CN | 101404480 | * | 4/2009 |
| CN | 101404480 | A | 4/2009 |
| CN | 10741325 | A | 6/2010 |
| CN | 101741325 | * | 6/2010 |
| CN | 201860297 | * | 6/2011 |
| CN | 201860297 | U | 6/2011 |
| CN | 102215029 | * | 10/2011 |
| CN | 102215029 | A | 10/2011 |
| CN | 202068381 | U | 12/2011 |
| CN | 202444468 | U | 9/2012 |
| WO | WO2011102092 | A1 | 8/2011 |

* cited by examiner

*Primary Examiner* — Paul Huber
(74) *Attorney, Agent, or Firm* — Han IP Corporation

(57) ABSTRACT

Disclosed is a circuit structure for implementing an adaptive function in a class-D audio power amplifier circuit, comprising an operation amplifier, a pulse width modulator and a driver stage that are sequentially and serially connected, an input terminal of the operation amplifier being connected to an external audio signal output terminal, and an output terminal of the driver stage being connected to a loudspeaker and connected to the input terminal of the operation amplifier via a feedback loop. The circuit structure further comprises: one or a plurality of a carrier adaptive circuit, a frequency adaptive circuit, a driver adaptive circuit, a temperature adaptive circuit.

10 Claims, 2 Drawing Sheets

CIRCUIT STRUCTURE FOR ACHIEVING ADAPTIVE FUNCTION IN CLASS-D AUDIO POWER AMPLIFIER CIRCUIT

CROSS REFERENCE TO RELATED APPLICATIONS

This application is the U.S. national phase application of International application number PCT/CN2012/085933, filed on 5 Dec. 2012, which claims the priority benefit of China Patent Application No. 201210045465.X, filed on 27 Feb. 2012, which is hereby incorporated by reference in its entirety.

TECHNICAL FIELD

Embodiments of the present disclosure relate to the field of audio power amplifier technologies, and in particular, to a circuit structure for implementing an adaptive function in a class-D audio power amplifier circuit.

BACKGROUND

Technical parameters of a conventional class-D audio power amplifier circuit tend to be designed to fixed parameters, for example, fixed carrier frequency, fixed frequency response, fixed gain setting (when stably-working), fixed temperature protection point, fixed driver current, and the like. Such design is simple. However, a drawback of such design lies in that when peripheral conditions of the circuit change or internal conditions thereof change, adjustment fails to be made to accommodate to these changes. Therefore, the best performance cannot be reached under different conditions, and under some circumstances, some negative effects may be caused.

For example, when the working temperature of the circuit is ever increasing due to transient changes of the ambient conditions and reaches the temperature protection point, according to the related art, the circuit may temporarily stop working since a temperature protection function which is triggered at a fixed temperature protection point is set. The audience may be unpleasant if no voice is output or even a short interruption of the voice output. Even worse, in most cases, the temperature protection setting of the circuit may repeatedly restart the circuit and thus cause non-contiguous voice output, or may directly cause the circuit to shutdown. In this case, the circuit needs to be restarted.

Still for example, the fixed carrier frequency is generally employed (when the frequency conversion and spectrum spreading technology is applied to reduce EMI) in the related art, which is set to a frequency 10 times higher than the audio domain, with a lower value of 200 kHz and a higher value of 600 kHz. A high-frequency carrier may boost the audio performance, which, compared with a low-frequency carrier, cause notable increase in power consumption and EMI.

Still for example, it is well known that the audio power amplifier circuits are all subject to differences in frequency response performance. Some circuits achieve excellent voice performance within a low-frequency range, some circuits achieve excellent voice performance within a high-frequency range, some circuits achieve excellent low-frequency distortion performance, and some circuits achieve excellent high-frequency distortion performance. When the circuit parameters are fixed, the frequency response is also fixed. Therefore, the employed circuit structure and the manufacture process thereof fail to accommodate frequency responses within various frequency ranges.

Yet still for example, the overshoot phenomenon tends to occur due to the output square wave of the class-D audio power amplifier, thereby causing such problems as distortion, power consumption, and EMI. Such problems are related to the fact that the output stage employs a fixed drive current.

In conclusion, design of fixed parameters in the class-D audio power amplifier circuit in the related art cannot accommodate parameter changes during practical application, and the class-D power amplifier circuit in the related art has defects.

SUMMARY

In view of the above defects in the related art, embodiments of the present disclosure provide an adaptive circuit having one or a plurality of a temperature adaptive circuit, a carrier adaptive circuit, a frequency adaptive circuit, and a driver adaptive circuit, to improve such performance of the class-D audio power amplifier as EMI, distortion, power consumption, frequency response, and temperature protection, and hence greatly enhance user experience. In addition, the circuit structure is simple in structure and low in cost, and is therefore widely applied.

To achieve the above objectives, embodiments of the present disclosure provide a circuit structure for implementing an adaptive function in a class-D audio power amplifier circuit.

The circuit structure comprises an operation amplifier, a pulse width modulator and a driver stage that are sequentially and serially connected, wherein an input terminal of the operation amplifier is connected to an external audio signal output terminal, and an output terminal of the driver stage is connected to a loudspeaker and connected to the input terminal of the operation amplifier via a feedback loop. The circuit structure further comprises a carrier adaptive circuit, wherein an input terminal of the carrier adaptive circuit is connected to the external audio signal output terminal, and an output terminal of the carrier adaptive circuit is connected to an input terminal of the pulse width modulator.

In the circuit structure, the carrier adaptive circuit comprises an amplitude detector and a carrier generator that are sequentially and serially connected, wherein an input terminal of the amplitude detector is connected to the external audio signal output terminal, and an output terminal of the carrier generator is connected to the input terminal of the pulse width modulator.

In the circuit structure, the carrier generator is a frequency-adjustable carrier generator.

The circuit structure further comprises a frequency adaptive circuit, wherein an input terminal of the frequency adaptive circuit is connected to the external audio signal output terminal, and an output terminal of the frequency adaptive circuit is respectively connected to the operation amplifier and the feedback loop.

In the circuit structure, the frequency adaptive circuit comprises a frequency detector and a parameter selection register that are sequentially and serially connected, wherein an input terminal of the frequency detector is connected to the external audio signal output terminal, and an output terminal of the parameter selection register is respectively connected to the operator amplifier and the feedback loop.

In the circuit structure, the output terminal of the parameter selection register is connected to the operation amplifier via an adjustable capacitor and connected to the feedback loop via an adjustable resistor.

The circuit structure further comprises a driver adaptive circuit, wherein an input terminal of the driver adaptive circuit is connected to the output terminal of the driver stage, and an output terminal of the driver adaptive circuit is connected to an input terminal of the driver stage.

In the circuit structure, the driver adaptive circuit comprises an edge detector and an adjustable driver circuit that are sequentially and serially connected, wherein an input terminal of the edge detector is connected to the output terminal of the driver stage, an output terminal of the edge detector is connected to an input of the adjustable driver circuit, and the adjustable driver circuit is further connected between an output terminal of the pulse width modulator and the input terminal of the driver stage.

The circuit structure further comprises a temperature adaptive circuit, wherein the temperature adaptive circuit is connected between the external audio signal output terminal and the input terminal of the operation amplifier.

In the circuit structure, the temperature adaptive circuit comprises a temperature detector, a gain controller and an adjustable circuit network that are sequentially and serially connected, wherein the adjustable circuit network is connected between the external audio signal output terminal and the input terminal of the operation amplifier.

The circuit structure further comprises: a frequency adaptive circuit, wherein an input terminal of the frequency adaptive circuit is connected to the external audio signal output terminal, and an output terminal of the frequency adaptive circuit is respectively connected to the operation amplifier and the feedback loop; a driver adaptive circuit, wherein an input terminal of the driver adaptive circuit is connected to the output terminal of the driver stage, and an output terminal of the frequency adaptive circuit is connected to an input terminal of the driver stage; a temperature adaptive circuit, wherein the temperature adaptive circuit is connected between the external audio signal output terminal and the input terminal of the operation amplifier.

According to the embodiments of the present disclosure, the circuit structure for implementing an adaptive function in a class-D audio power amplifier circuit further comprises a carrier adaptive circuit, a frequency adaptive circuit, a driver adaptive circuit, and a temperature adaptive circuit, and is thus capable of making timely automatic adjustment to accommodate changes of the amplitude and frequency of an input signal, and changes of the ambient temperature and output current of the driver stage, thereby improving such performance of the class-D audio power amplifier as EMI, distortion, power consumption, frequency response, and temperature protection, and hence greatly enhancing user experience. In addition, the circuit structure is simple in structure and low in cost, and is therefore widely applied.

DETAILED DESCRIPTION OF THE PREFERRED EMBODIMENTS

For a better understanding of technical disclosure of the present disclosure, detail description is given hereafter with reference to exemplary embodiments.

Figure 1:
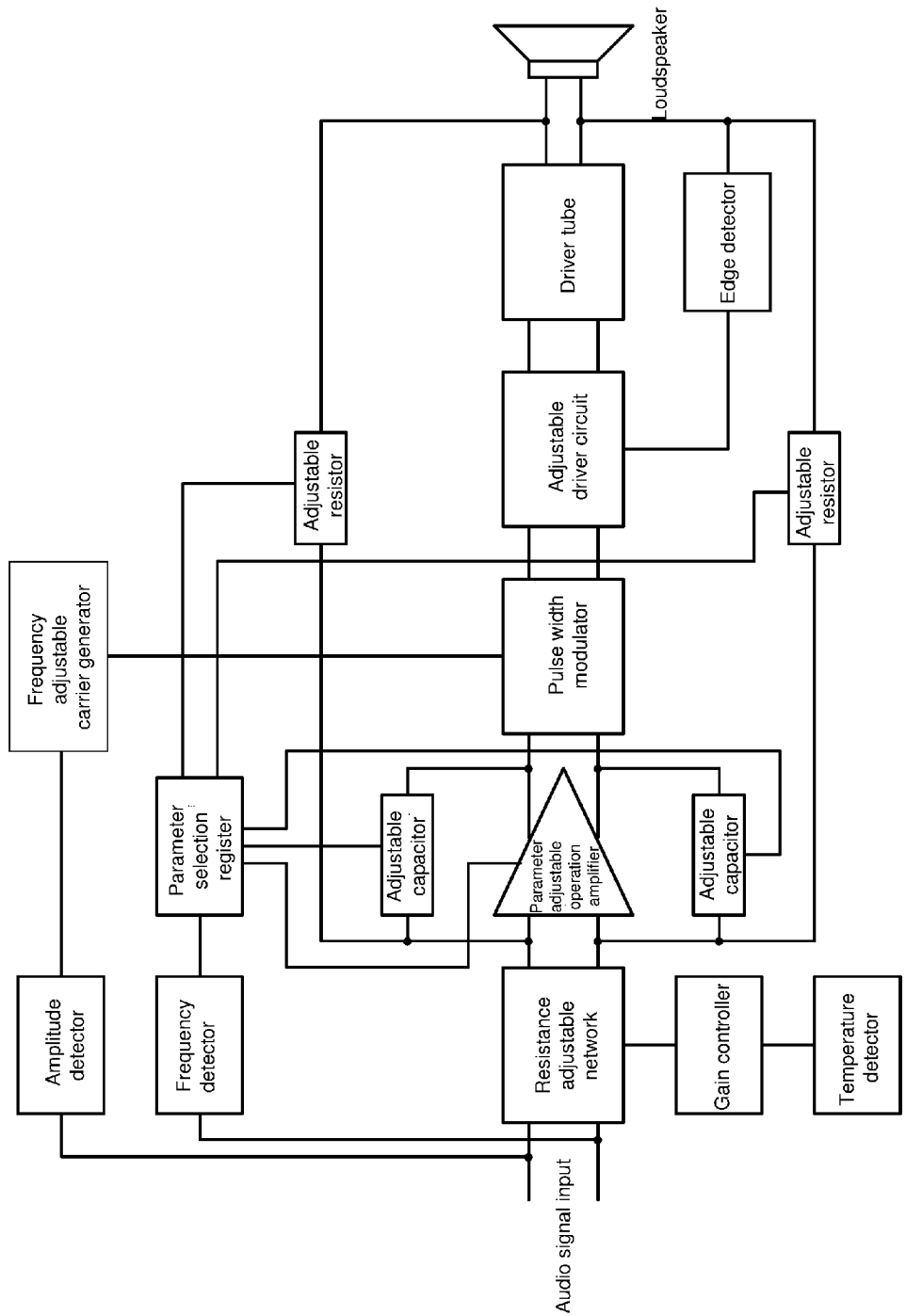
FIG. 1 is a schematic view of a circuit structure for implementing an adaptive function in a class-D audio power amplifier circuit according to an embodiment of the present disclosure.

FIG. 1 illustrates a schematic structural view of a circuit structure for implementing an adaptive function in a class-D audio power amplifier circuit according to an embodiment of the present disclosure. In an embodiment, the circuit structure comprises an operation amplifier, a pulse width modulator and a driver stage that are sequentially and serially connected, wherein an input terminal of the operation amplifier is connected to an external audio signal output terminal, and an output terminal of the driver stage is connected to a loudspeaker and connected to the input terminal of the operation amplifier via a feedback loop. The circuit structure further comprises at least one of a carrier adaptive circuit, a frequency adaptive circuit, a driver adaptive circuit, and a temperature adaptive circuit.

An input terminal of the carrier adaptive circuit is connected to the external audio signal output terminal, and an output terminal of the carrier adaptive circuit is connected to an input terminal of the pulse width modulator. An input terminal of the frequency adaptive circuit is connected to the external audio signal output terminal, and an output terminal of the frequency adaptive circuit is respectively connected to the operation amplifier and the feedback loop. An input terminal of the driver adaptive circuit is connected to the output terminal of the driver stage, and an output terminal of the frequency adaptive circuit is connected to an input terminal of the driver stage. The temperature adaptive circuit is connected between the external audio signal output terminal and the input terminal of the operation amplifier.

Figure 2:
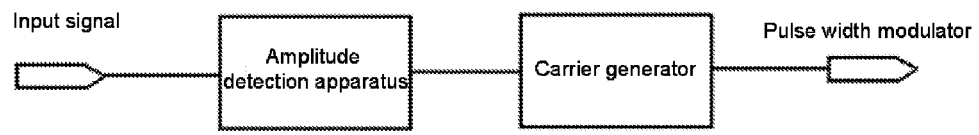
FIG. 2 is a schematic structural view of a carrier adaptive structure in a circuit structure for implementing an adaptive function in a class-D audio power amplifier circuit according to an embodiment of the present disclosure.

In a preferred embodiment, as illustrated in FIG. 2, the carrier adaptive circuit comprises an amplitude detector and a carrier generator that are sequentially and serially connected, wherein an input terminal of the amplitude detector is connected to the external audio signal output terminal, and an output terminal of the carrier generator is connected to the input terminal of the pulse width modulator.

In a further preferred embodiment, the carrier generator is a frequency-adjustable carrier generator.

Figure 3:
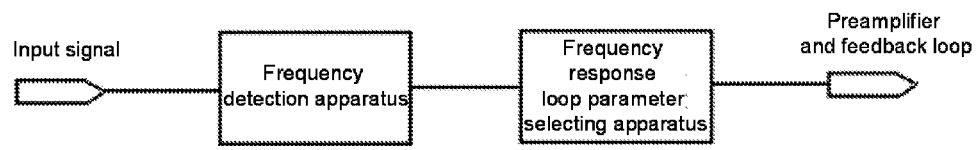
FIG. 3 is a schematic structural view of a frequency adaptive structure in a circuit structure for implementing an adaptive function in a class-D audio power amplifier circuit according to an embodiment of the present disclosure.

In another preferred embodiment, as illustrated in FIG. 3, the frequency adaptive circuit comprises a frequency detector and a parameter selection register that are sequentially and serially connected, wherein an input terminal of the frequency detector is connected to the external audio signal output terminal, and an output terminal of the parameter selection register is respectively connected to the operator amplifier and the feedback loop.

In a further preferred embodiment, the output terminal of the parameter selection register is connected to the operation amplifier via an adjustable capacitor and connected to the feedback loop via an adjustable resistor.

Figure 4:
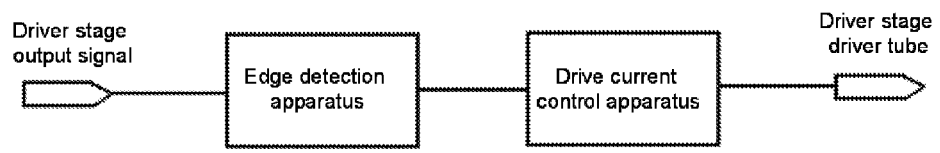
FIG. 4 is a schematic structural view of a driver adaptive structure in a circuit structure for implementing an adaptive function in a class-D audio power amplifier circuit according to an embodiment of the present disclosure.

In still another preferred embodiment, as illustrated in FIG. 4, the driver adaptive circuit comprises an edge detector and an adjustable driver circuit that are sequentially and serially connected, wherein an input terminal of the edge detector is connected to the output terminal of the driver stage, an output terminal of the edge detector is connected to an input of the adjustable driver circuit, and the adjustable driver circuit is further connected between an output terminal of the pulse width modulator and the input terminal of the driver stage.

Figure 5:
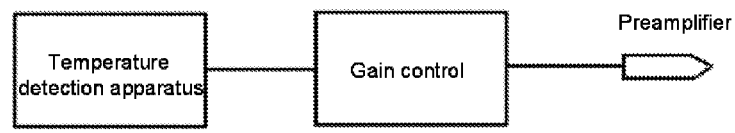
FIG. 5 is a schematic structural view of a temperature adaptive structure in a circuit structure for implementing an adaptive function in a class-D audio power amplifier circuit according to an embodiment of the present disclosure.

In yet still another embodiment, as illustrated in FIG. 5, the temperature adaptive circuit comprises a temperature detector, a gain controller and an adjustable circuit network that are sequentially and serially connected, wherein the adjustable circuit network is connected between the external audio signal output terminal and the input terminal of the operation amplifier.

In practice, with respect to the defects in the related art, the circuit structure for implementing an adaptive function in a class-D audio power amplifier circuit according to the embodiments of the present disclosure may comprise one or a plurality of adaptive circuits.

The temperature detection apparatus is configured to detect temperature changes of the circuit and output the same to the gain control module, whereupon the gain control module adjusts the gain set by a preamplifier. When the temperature of the circuit increases due to ambient factors, if the temperature increase is sharp and approaches the temperature protection point, the circuit gain decreases to reduce heat production, but does not immediately stop the operation unless the circuit temperature still increases after the gain is decreased. Afterwards, when the temperature decreases and is lower than a specific value, the circuit gain recovers to its originally-set value. If the circuit temperature in this case does not increase sharply, this stable state is maintained; and if the circuit temperature still increases sharply, the previous gain that is reduced based on the original one is employed again and maintained unchanged. Subsequently, when the circuit temperature decreases notably and maintains for a period of time, the circuit gain recovers to its originally-set value again. Such a mechanism prevents the circuit from shutdown caused by the temperature protection due to temporary temperature increase, thereby improving audio experience.

The amplitude detection apparatus is configured to detect the amplitude of an input signal, and control, according to the amplitude, the carrier frequency output by the carrier generator to the pulse width modulator. When the amplitude of the input signal is small, the carrier frequency is improved; and when the amplitude of the input signal is large, the carrier frequency is deduced. Such settings are advantageous in that audio quality is improved as far as possible when the voice volume is low, and EMI and power consumption are reduced as far as possible when the voice volume is high.

The frequency detection apparatus is configured to detect the frequency of an input signal, wherein different frequencies determine different frequency response loop parameters, which are used to set parameter values of the preamplifier and the feedback loop. When there are abundant input signals in the low-frequency domain, a loop whose frequency response prefers the low-frequency domain is set; and when there are abundant input signals in the high-frequency domain, a loop whose frequency response prefers the high-frequency domain is set. In this way, the circuit achieves a better performance in all frequency bands.

The edge detection apparatus is configured to detect changes of a rising or falling edge of an output signal of the driver stage, and determine when and how to change the drive current. In cases of forward drive, the drive current remains unchanged and gradually decreases when the voltage of a power supply is approached; and in cases of backward drive, the drive current remains unchanged and gradually decreases when the zero potential is approached. Such settings prevent the voltage shoot, reduce the distortion, power consumption and EMI.

The above-described adaptive circuits, i.e., the temperature adaptive circuit, the carrier adaptive circuit, the frequency adaptive circuit, and the driver adaptive circuit may be separately employed or collaboratively employed.

To be specific, the temperature adaptive circuit comprises a temperature detector, a gain controller, and a resistance-adjustable network. An effective logic control at different temperature points may be implemented using a positive temperature coefficient of a resistor and a negative temperature coefficient of a triode and combining a comparator. The gain controller controls, according to a detection result of the temperature detector, the resistance-adjustable network, which may be implemented by selecting one from data selectors. The resistance-adjustable network is a set of resistors that are serially and parallelly connected. Based on output of the gain controller, a resistance value applied to the input terminal of the operation amplifier may be determined, and thus voltage gain of the entire circuit may be adjusted.

A temperature protection threshold (protection threshold) may be set for the temperature detector, wherein when the circuit temperature exceeds the temperature protection threshold, the circuit enters a temperature protection state, and hence stops working. Optionally, a trigger threshold (i.e., an enable threshold) may be set for the temperature detector to output an enable logic signal to enable the gain controller, wherein when the circuit temperature reaches the trigger threshold, the gain controller is enabled to control the increase of the resistance value of the resistance-adjustable network and the decrease of the circuit gain. Optionally, a trigger threshold (i.e., a disable threshold) may be set for the temperature detector to output a disable logic signal to disable the gain controller, wherein when the circuit temperature decreases to reach the trigger threshold, the gain controller is disabled such that the resistance value of the resistance-adjustable network recovers to an original value, and when the circuit temperature remains between the trigger threshold for enabling the gain controller and the trigger threshold for disabling the gain controller, the temperature detector controls the gain controller such that the resistance value of the resistance-adjustable network remains unchanged, and the original resistance value and gain does not recover until the circuit temperature decreases to exceed the disable threshold by some degrees (recovery threshold). As a result, when the circuit temperature is increasing, the circuit is not immediately shut down, but the gain is reduced (lower the voice volume) to enable the circuit to work in a low gain (low voice volume) state before the circuit temperature recovers to a normal state.

The carrier adaptive circuit comprises an amplitude detector and a frequency-adjustable carrier generator. The amplitude detector is formed by the comparator, wherein one terminal thereof is for receiving an input signal, and the other terminal thereof is applied with one of a group of preset voltages. Each of the voltages corresponds to a carrier frequency generated by the frequency-adjustable carrier generator. Typically, a carrier generator may be formed by an annular oscillator circuit, and the frequency-adjustable carrier generator enables resistance and capacitance parameters related to the frequency to be variable and adjustable.

Preset voltages are sequentially compared with the voltage of the input signal for a period of time according to a high-to-low order. If the preset voltage is higher than the voltage of the input signal, the preset voltage is reduced for comparison with the voltage of the input signal before the comparator outputs a reverse result. In this case, the corresponding preset voltage is configured to control the frequency-adjustable carrier generator to generate a carrier having a corresponding frequency. The amplitude detector is configured to: when detecting that the amplitude of the input signal is small, control the frequency-adjustable carrier generator to output a high carrier frequency; and when detecting that the amplitude of the input signal is large, control the frequency-adjustable carrier generator to output a low carrier frequency.

The frequency adaptive circuit comprises a frequency detector, a parameter selection register, a parameter-adjustable operation amplifier, an adjustable resistor, and an adjustable capacitor. The frequency detector may be formed by a high-pass filter, an integrator, a low-pass filter, and a comparator. Input signals are transmitted through the high-pass filter, the integrator compares high-frequency components with low-frequency component of the low-pass filter to determine high-frequency and low-frequency portions, and the parameter selection register determines values of parameters in the parameter-adjustable operation amplifier, resistor, and capacitor. In this way, low-frequency or high-frequency performance is dynamically optimized according to the frequency distribution of the input signals. When there are more the high-frequency components, the high-frequency performance is optimized, and when there are more low-frequency components, the low-frequency performance is optimized.

The driver adaptive circuit comprises an edge detector and an adjustable driver circuit. The edge detector is configured to detect changes of rising or falling of an output signal, and compare the changes with the voltage (which is preset) at the other end of the comparator, wherein the comparison result is used to control the adjustable driver circuit. When the rising (conversion from a low level to a high level) of the output signal reaches a preset value, the drive current of the adjustable driver circuit changes from smaller to larger. In this case, the output signal has a sharp rising edge and a slow sharp point. Analogously, when the falling (conversion from a high level to a low level) of the output signal reaches a preset value, the drive current of the adjustable driver circuit changes from larger to smaller. In this case, the output signal has a sharp falling edge and a slow sharp point, and during the remaining time, the drive current remains its originally-set value.

According to the embodiments of the present disclosure, the circuit structure for implementing an adaptive function in a class-D audio power amplifier circuit further comprises a carrier adaptive circuit, a frequency adaptive circuit, a driver adaptive circuit, and a temperature adaptive circuit, and is thus capable of making timely automatic adjustment to accommodate changes of the amplitude and frequency of an input signal, and changes of the ambient temperature and output current of the driver stage, thereby improving such performance of the class-D audio power amplifier as EMI, distortion, power consumption, frequency response, and temperature protection, and hence greatly enhancing user experience. In addition, the circuit structure is simple in structure and low in cost, and is therefore widely applied Detailed above are merely exemplary embodiments for illustrating the present disclosure. It should be noted that various modifications and variations may be made thereto without departing from the spirit and scope of the present disclosure. Therefore, the specification and drawings shall be deemed as illustration instead of limitation.

What is claimed is:

1. A circuit structure for implementing an adaptive function in a class-D audio power amplifier circuit, the circuit structure comprising:

an operation amplifier, a pulse width modulator and a driver stage that are sequentially and serially connected, an input terminal of the operation amplifier configured to be connected to an external audio signal output terminal, and an output terminal of the driver stage configured to be connected to a loudspeaker and connected to the input terminal of the operation amplifier via a feedback loop;

wherein the circuit structure further comprises a carrier adaptive circuit comprising:
an input terminal configured to be connected to the external audio signal output terminal; and
an output terminal configured to be connected to an input terminal of the pulse width modulator, and wherein the circuit structure further comprises a frequency adaptive circuit comprising:
an input terminal configured to be connected to the external audio signal output terminal; and
an output terminal being respectively connected to the operation amplifier and the feedback loop.

2. The circuit structure of claim 1, wherein the carrier adaptive circuit further comprises an amplitude detector and a carrier generator that are sequentially and serially connected, wherein an input terminal of the amplitude detector is configured to be connected to the external audio signal output terminal, and wherein an output terminal of the carrier generator is connected to the input terminal of the pulse width modulator.

3. The circuit structure of claim 2, wherein the carrier generator is a frequency-adjustable carrier generator.

4. The circuit structure of claim 1, wherein the frequency adaptive circuit further comprises a frequency detector and a parameter selection register that are sequentially and serially connected, wherein an input terminal of the frequency detector is configured to be connected to the external audio signal output terminal, and wherein an output terminal of the parameter selection register is respectively connected to the operator amplifier and the feedback loop.

5. The circuit structure of claim 4, wherein the output terminal of the parameter selection register is connected to the operation amplifier via an adjustable capacitor and connected to the feedback loop via an adjustable resistor.

6. The circuit structure of claim 1, further comprising a driver adaptive circuit having:
an input terminal connected to the output terminal of the driver stage; and
an output terminal connected to an input terminal of the driver stage.

7. The circuit structure of claim 6, wherein the driver adaptive circuit further comprises an edge detector and an adjustable driver circuit that are sequentially and serially connected, wherein an input terminal of the edge detector is connected to the output terminal of the driver stage, wherein an output terminal of the edge detector is connected to an input of the adjustable driver circuit, and wherein the adjustable driver circuit is further connected between an output terminal of the pulse width modulator and the input terminal of the driver stage.

8. The circuit structure of claim 1, further comprising a temperature adaptive circuit configured to be connected between the external audio signal output terminal and the input terminal of the operation amplifier.

9. The circuit structure of claim 8, wherein the temperature adaptive circuit comprises a temperature detector, a gain controller and an adjustable circuit network that are sequentially and serially connected, and wherein the adjustable circuit network is configured to be connected between the external audio signal output terminal and the input terminal of the operation amplifier.

10. The circuit structure of claim 1, further comprising:
a driver adaptive circuit having an input terminal, connected to the output terminal of the driver stage, and an output terminal, connected to an input terminal of the driver stage; and
a temperature adaptive circuit configured to be connected between the external audio signal output terminal and the input terminal of the operation amplifier.

* * * * *